(12) United States Patent
Kawata

(10) Patent No.: US 8,900,363 B2
(45) Date of Patent: Dec. 2, 2014

(54) INLINE VACUUM PROCESSING APPARATUS, METHOD OF CONTROLLING THE SAME, AND INFORMATION RECORDING MEDIUM MANUFACTURING METHOD

(75) Inventor: Masahiro Kawata, Hachioji (JP)

(73) Assignee: Canon Anelva Corporation, Kawaski-shi, Kanagawa-ken (JP)

( * ) Notice: Subject to any disclaimer, the term of this patent is extended or adjusted under 35 U.S.C. 154(b) by 1196 days.

(21) Appl. No.: 12/644,995

(22) Filed: Dec. 22, 2009

(65) Prior Publication Data
US 2010/0166980 A1 Jul. 1, 2010

(30) Foreign Application Priority Data

Dec. 26, 2008 (JP) .................................. 2008-335157
Dec. 15, 2009 (JP) .................................. 2009-284468

(51) Int. Cl.
| | | |
|---|---|---|
| C23C 16/00 | (2006.01) | |
| C23F 1/00 | (2006.01) | |
| C23C 16/54 | (2006.01) | |
| C23C 16/52 | (2006.01) | |

(52) U.S. Cl.
CPC ................. *C23C 16/54* (2013.01); *C23C 16/52* (2013.01)
USPC ........... 118/715; 700/108; 700/114; 700/112; 700/121; 156/345.32; 156/345.31; 156/345.23; 156/345.28; 118/719

(58) Field of Classification Search
USPC ............................ 118/719, 688, 669; 700/123
See application file for complete search history.

(56) References Cited

U.S. PATENT DOCUMENTS

| | | | | | |
|---|---|---|---|---|---|
| 4,852,516 | A | * | 8/1989 | Rubin et al. | ................... 118/715 |
| 5,006,192 | A | * | 4/1991 | Deguchi | ................... 156/345.44 |
| 5,110,249 | A | * | 5/1992 | Norman | ........................ 414/217 |
| 5,256,204 | A | * | 10/1993 | Wu | ............................... 118/719 |
| 5,687,085 | A | * | 11/1997 | Morimoto et al. | ............. 700/121 |
| 5,820,679 | A | * | 10/1998 | Yokoyama et al. | ........... 118/719 |
| 5,830,310 | A | | 11/1998 | Doi | |

(Continued)

FOREIGN PATENT DOCUMENTS

| | | |
|---|---|---|
| JP | 63-14421 | 1/1988 |
| JP | 63-129628 | 6/1988 |

(Continued)

OTHER PUBLICATIONS

Japanese Office Action issued in Japanese Patent Application No. 2009-284468, dated Jul. 12, 2013, and English translation thereof.

*Primary Examiner* — Gordon R Baldwin
*Assistant Examiner* — Charlee Bennett
(74) *Attorney, Agent, or Firm* — Buchanan Ingersoll & Rooney PC

(57) ABSTRACT

An inline vacuum processing apparatus includes a deposition unit, a process execution unit, a determination unit, and a control unit. The deposition unit causes one deposition chamber of a first deposition chamber and a second deposition chamber to execute a deposition process. The process execution unit causes the other deposition chamber to execute a process necessary for the deposition process. The determination unit measures the number of substrates processed in one deposition chamber and determines whether all substrates included in a first lot have undergone the deposition process. The control unit switches, based on a determination result from the determination unit, a process to be executed in each of the first deposition chamber and the second deposition chamber.

8 Claims, 10 Drawing Sheets

(56) References Cited

U.S. PATENT DOCUMENTS

| | | | |
|---|---|---|---|
| 5,900,161 A | 5/1999 | Doi | |
| 5,928,389 A * | 7/1999 | Jevtic | 29/25.01 |
| 6,079,354 A * | 6/2000 | Guo et al. | 118/719 |
| 6,143,148 A * | 11/2000 | Gagliardi et al. | 204/298.26 |
| 6,152,070 A * | 11/2000 | Fairbairn et al. | 118/719 |
| 6,207,005 B1 * | 3/2001 | Henley et al. | 156/345.32 |
| 6,245,149 B1 * | 6/2001 | de Lomenie et al. | 118/719 |
| 6,273,955 B1 * | 8/2001 | Yoshino et al. | 118/718 |
| 6,290,824 B1 * | 9/2001 | Ishikawa et al. | 204/298.16 |
| 6,303,044 B1 * | 10/2001 | Koemtzopoulos et al. | 216/59 |
| 6,482,752 B1 * | 11/2002 | Yamazaki et al. | 438/758 |
| 6,534,007 B1 * | 3/2003 | Blonigan et al. | 422/62 |
| 6,889,110 B1 * | 5/2005 | Jain et al. | 700/121 |
| 6,911,398 B2 * | 6/2005 | Narita et al. | 438/706 |
| 7,110,845 B2 * | 9/2006 | Suzuki | 700/121 |
| 7,429,300 B2 * | 9/2008 | Kido et al. | 118/719 |
| 7,709,814 B2 * | 5/2010 | Waldfried et al. | 250/492.2 |
| 2004/0007181 A1 * | 1/2004 | Yasuno | 118/723 E |
| 2004/0065344 A1 * | 4/2004 | Oka et al. | 134/1.1 |
| 2004/0194888 A1 * | 10/2004 | Ito | 156/345.31 |
| 2005/0115830 A1 * | 6/2005 | Furukawa et al. | 204/298.25 |
| 2006/0130873 A1 * | 6/2006 | Richardson et al. | 134/1.1 |
| 2011/0195199 A1 * | 8/2011 | Huber et al. | 427/534 |

FOREIGN PATENT DOCUMENTS

| | | |
|---|---|---|
| JP | 08-193271 | 7/1996 |
| JP | 11-092931 | 4/1999 |
| JP | 11-229150 A | 8/1999 |
| JP | 2001-351868 | 12/2001 |
| JP | 2002-008226 | 1/2002 |
| JP | 2002-133650 A | 5/2002 |
| JP | 2002-260222 | 9/2002 |
| JP | 2002-25047 A | 1/2005 |
| JP | 2006-086325 | 3/2006 |

* cited by examiner

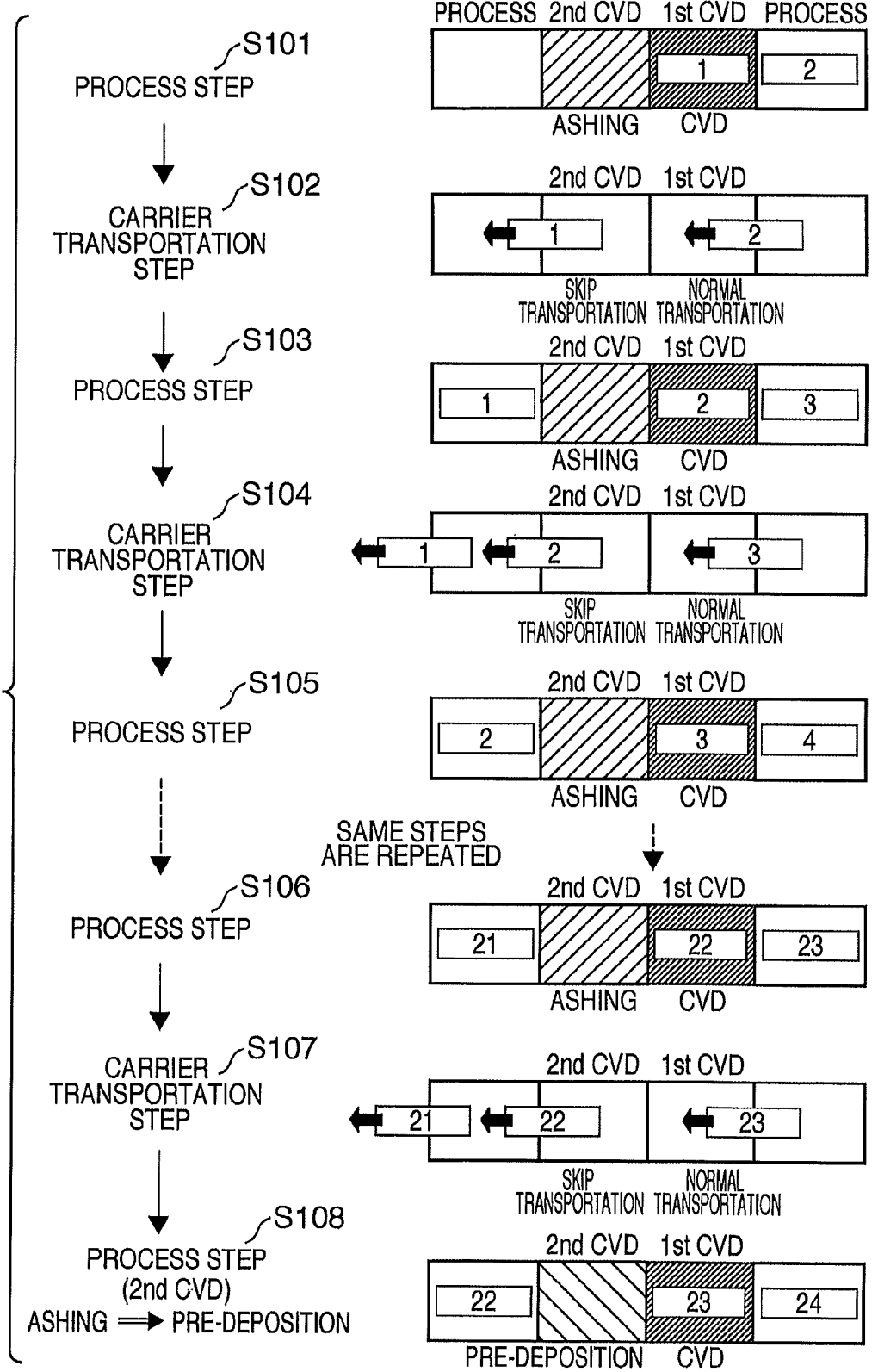

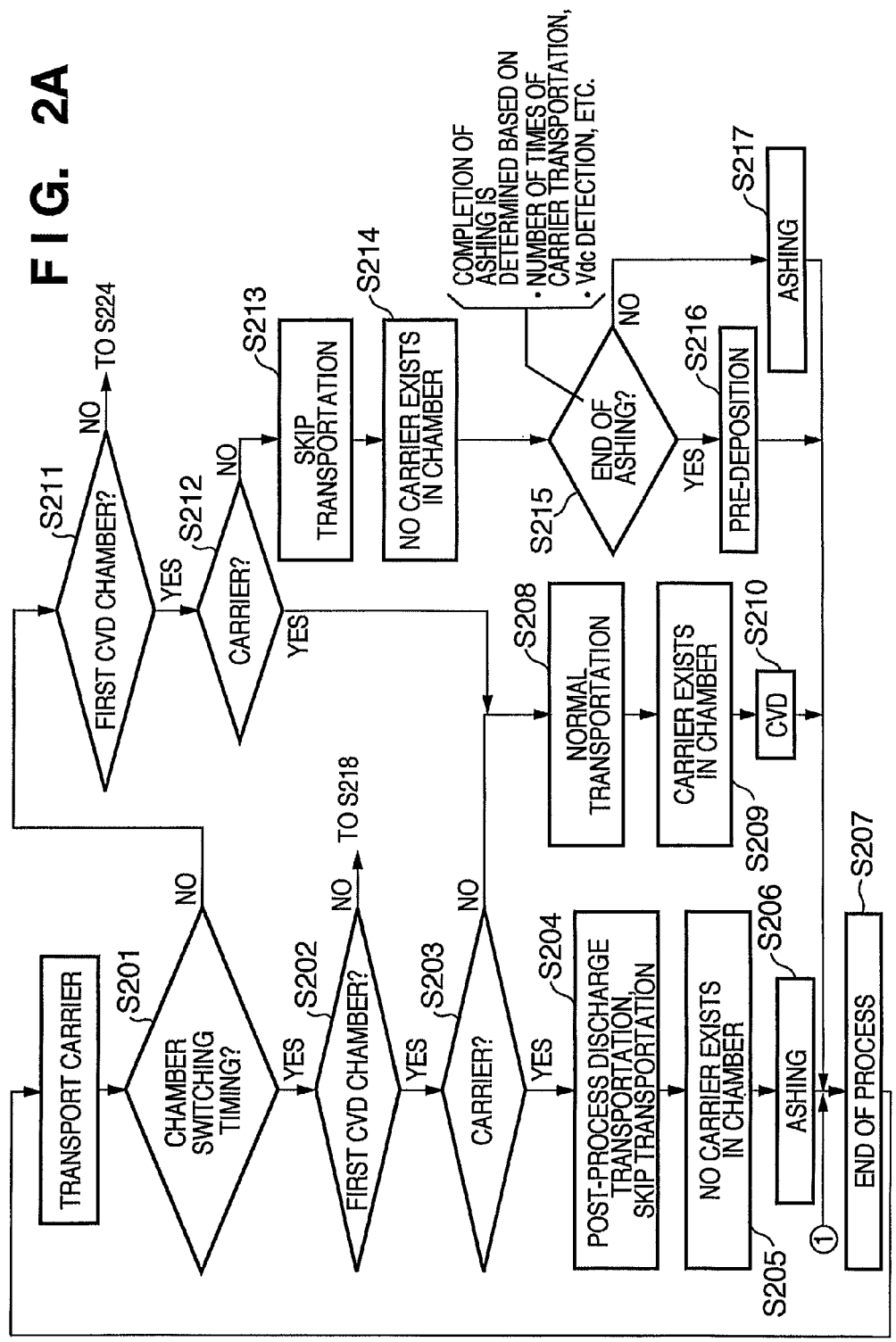

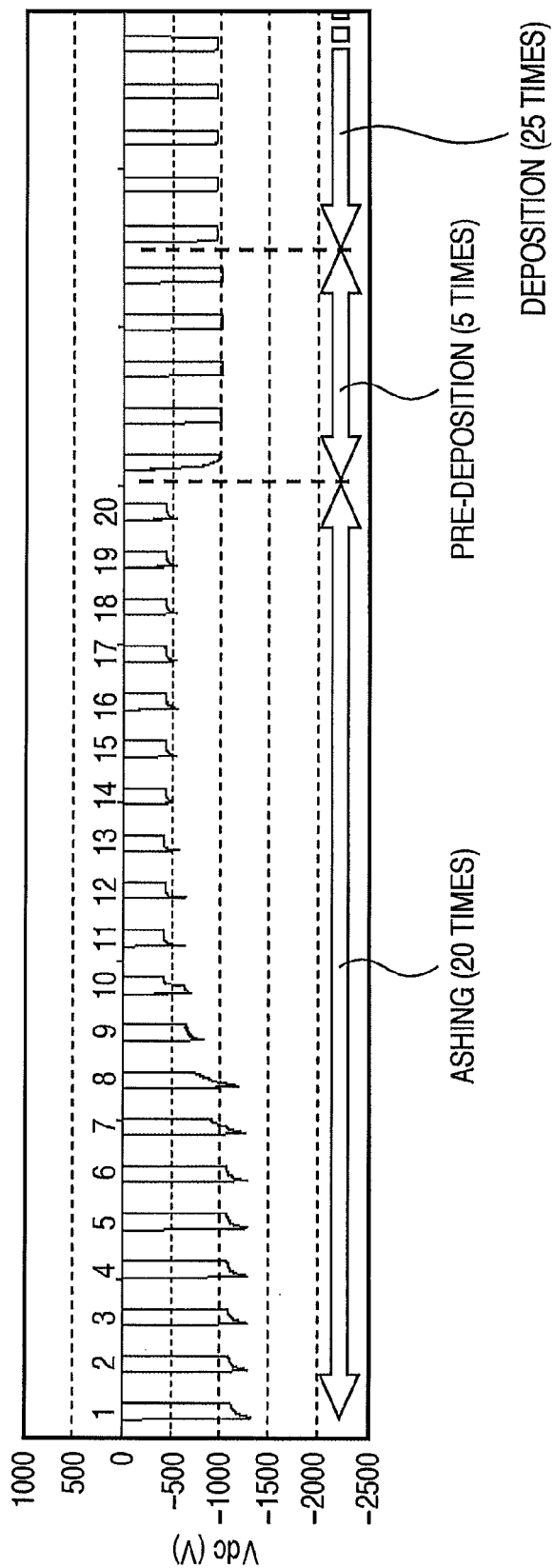

INLINE VACUUM PROCESSING APPARATUS, METHOD OF CONTROLLING THE SAME, AND INFORMATION RECORDING MEDIUM MANUFACTURING METHOD

BACKGROUND OF THE INVENTION

1. Field of the Invention

The present invention relates to an inline vacuum processing apparatus for manufacturing an information recording disk having a carbon protective film on a magnetic film serving as a recording layer, a method of controlling the same, and an information recording medium manufacturing method.

2. Description of the Related Art

A magnetic recording disk such as a hard disk is formed by sequentially stacking, on the upper surface or both of the upper and lower surfaces of, e.g., an aluminum or glass substrate, a metal underlying film made of Cr or the like, a magnetic recording film made of CoCrTa or the like, and a protective film made of a carbon film or the like to protect the magnetic recording film from corrosion caused by contact with a magnetic head or air.

The carbon film was conventionally formed by sputtering deposition. However, the rising recording density is requiring the carbon protective film to be thinner and have necessary durability. Plasma CVD is used nowadays because it can form a very hard and thin, carbon protective film (Diamond-Like Carbon: DLC).

A general plasma CVD apparatus includes a chamber capable of forming a vacuum inside, and a pair of parallel plate electrodes installed in the chamber. A substrate is placed on the grounded anode. In this state, a reaction gas such as $CH_4$ or $C_6H_5CH_3$ containing carbon is introduced into the chamber. A voltage is applied between the electrodes to generate a plasma, thereby depositing a carbon film on the substrate surface.

However, plasma CVD deposits the carbon film not only on the substrate surface but also around it, i.e., on the exposed inner surface of the chamber. As the carbon film formation on a substrate is repeated, the carbon film deposited on the inner surface of the chamber gradually thickens unless the formed carbon film is removed each time. The carbon film deposited inside the chamber peels off in time due to internal stress or the like and generates carbon particles.

In manufacturing a magnetic recording disk, to improve the productivity, there is a demand for omitting a process that is not directly relevant to the manufacture such as a process of removing the carbon film deposited inside the plasma CVD chamber. This need is especially strong for a so-called inline information disk forming apparatus formed by endlessly connecting, in a line, a plurality of chambers to be used for thin film formation and processing.

In a magnetic information disk forming apparatus, every time a process of a chamber in the production line has ended, the carrier is sequentially moved to the adjacent chamber so that the next process is executed for the substrate on the carrier. Each chamber is designed to perform a process for a substrate held on each carrier. The overall production efficiency of the production line is therefore decided by the most time-consuming one of the processes in the chambers.

In magnetic recording disk forming, normally, carbon protective film formation by plasma CVD is the most time-consuming process. Hence, executing not only the most time-consuming process for forming a carbon protective film by plasma CVD but also a process of removing the carbon film inside the chamber lowers the productivity of the entire production line. There is a demand for minimizing the decrease of the productivity.

However, without carbon film removal, particles generated upon peeling off the carbon film stick to the substrate surface to form projections on the surface of the carbon film formed on the substrate (cause local film thickness abnormality). These projections pose a problem in a lubricant layer formation process later and also become a cause of defectives.

A conventional information recording disk deposition apparatus prepares two carbon protective film formation chambers (CVD chambers) to form a carbon protective film. In one carbon protective film formation chamber, carbon protective film formation (deposition) is performed. During that time, in the other carbon protective film formation chamber, a carbon film deposited on its exposed inner surface is removed by ashing using oxygen plasma. This process is alternately repeated for each carrier for a substrate, thereby preventing particle generation without lowering the productivity (e.g., Japanese Patent Laid-Open Nos. 2002-133650 and 11-229150).

Another method is also adopted, which prepares at least three carbon protective film formation chambers and controls carrier transportation so as to always make one of the carbon protective film formation chambers perform ashing, aiming at further improving the productivity. Use of this method allows not only to improve the productivity but also to shorten the time of replacing a process gas to be used for carbon protective film formation with a process gas to be used for ashing (e.g., Japanese Patent Laid-Open No. 2002-25047).

The conventional information recording disk deposition apparatus prepares two or three carbon protective film formation chambers (CVD chambers) to form a carbon protective film. Ashing is performed in one of the chambers while carbon protective film deposition is performed in a remaining chamber. This enables to form a carbon protective film with few particles while ensuring the productivity.

However, when two carbon protective film formation chambers are used, replacement of the process gas for carbon protective film formation with that for ashing takes time.

Using three or more carbon protective film formation chambers makes it possible to improve the productivity as compared to the composition using two carbon protective film formation chambers and also shorten the time of replacing the process gas for carbon protective film formation with that for ashing. However, since the number of carbon protective film formation chambers increases, the apparatus becomes bulky (the apparatus installation area increases), and expensive. Additionally, it is necessary to sequentially change the chamber without the carrier among the three or more carbon protective film formation chambers, resulting in very complex carrier transportation control.

As a problem common to the composition with two carbon protective film formation chambers and the composition with three or more chambers, immediately after the process has changed from ashing to plasma CVD, the atmosphere in the chamber is not stable yet, and the characteristics of a carbon protective film formed on a substrate at that time are poor.

Normally, for example, 25 substrates in one cassette are supplied to the apparatus. Hence, a demand has arisen for processing substrates in a single cassette in the same carbon protective film formation chamber for substrate quality management. In the conventional methods, however, such a process is impossible because the chamber used for carbon protective film formation changes for each substrate.

SUMMARY OF THE INVENTION

The present invention provides an inline vacuum processing technique capable of substantially shortening the carbon protective film formation time and improving the productivity without making the apparatus bulky and expensive.

According to one aspect of the present invention, there is provided an inline vacuum processing apparatus including a first deposition chamber and a second deposition chamber, comprising:

a deposition unit configured to cause one deposition chamber of the first deposition chamber and the second deposition chamber to execute a deposition process so as to perform, in the same deposition chamber, the deposition process for a group of a plurality of substrates included in a first lot;

a process execution unit configured to cause the other deposition chamber where the deposition process is not being performed to execute a process necessary for the deposition process while the one deposition chamber is executing the deposition process;

a determination unit configured to measure the number of substrates processed in the one deposition chamber and determine whether all substrates included in the first lot have undergone the deposition process; and a control unit configured to switch, based on a determination result from the determination unit, the process to be executed in each of the first deposition chamber and the second deposition chamber so as to cause the other deposition chamber to execute the deposition process and cause the one deposition chamber to execute the process necessary for the deposition process.

According to another aspect of the present invention, there is provided a method of controlling an inline vacuum processing apparatus including a first deposition chamber and a second deposition chamber, comprising steps of:

causing one deposition chamber of the first deposition chamber and the second deposition chamber to execute a deposition process so as to perform, in the same deposition chamber, the deposition process for a group of a plurality of substrates included in a first lot;

causing the other deposition chamber where the deposition process is not being performed to execute a process necessary for the deposition process while the one deposition chamber is executing the deposition process;

measuring the number of substrates processed in the one deposition chamber and determining whether all substrates included in the first lot have undergone the deposition process; and switching, based on a determination result in the determining step, the process to be executed in each of the first deposition chamber and the second deposition chamber so as to cause the other deposition chamber to execute the deposition process and cause the one deposition chamber to execute the process necessary for the deposition process.

According to still another aspect of the present invention, there is provided an information recording medium manufacturing method comprising the step of performing deposition on a substrate using the above-mentioned inline vacuum processing apparatus.

According to the present invention, it is possible to provide an inline vacuum processing technique capable of substantially shortening the carbon protective film formation time and improving the productivity without making the apparatus bulky and expensive.

Further features of the present invention will become apparent from the following description of exemplary embodiments (with reference to the attached drawings).

BRIEF DESCRIPTION OF THE DRAWINGS

FIG. 1A is a view for explaining the procedure of processing in chambers included in an inline vacuum processing apparatus;

FIGS. 2A and 2B are flowcharts for explaining the procedure of changing the carrier transportation form;

FIG. 7 is a graph showing a Vdc measurement result.

DESCRIPTION OF THE EMBODIMENTS

Preferred embodiments of the present invention will now be described exemplarily in detail with reference to the accompanying drawings. Note that the constituent elements described in the embodiments are merely examples. The technical scope of the present invention is determined by the scope of claims and is not limited by the following individual embodiments.

The production line of an information recording medium (to be referred to as an "information recording disk" hereinafter) includes a load lock chamber to mount a substrate on a carrier, an unload lock chamber to unload the substrate from the carrier, and chambers to execute a plurality of manufacturing processes. The chambers are connected in series and arranged in a line or in a rectangular form, thereby forming an information recording disk production line.

Figure 1B:
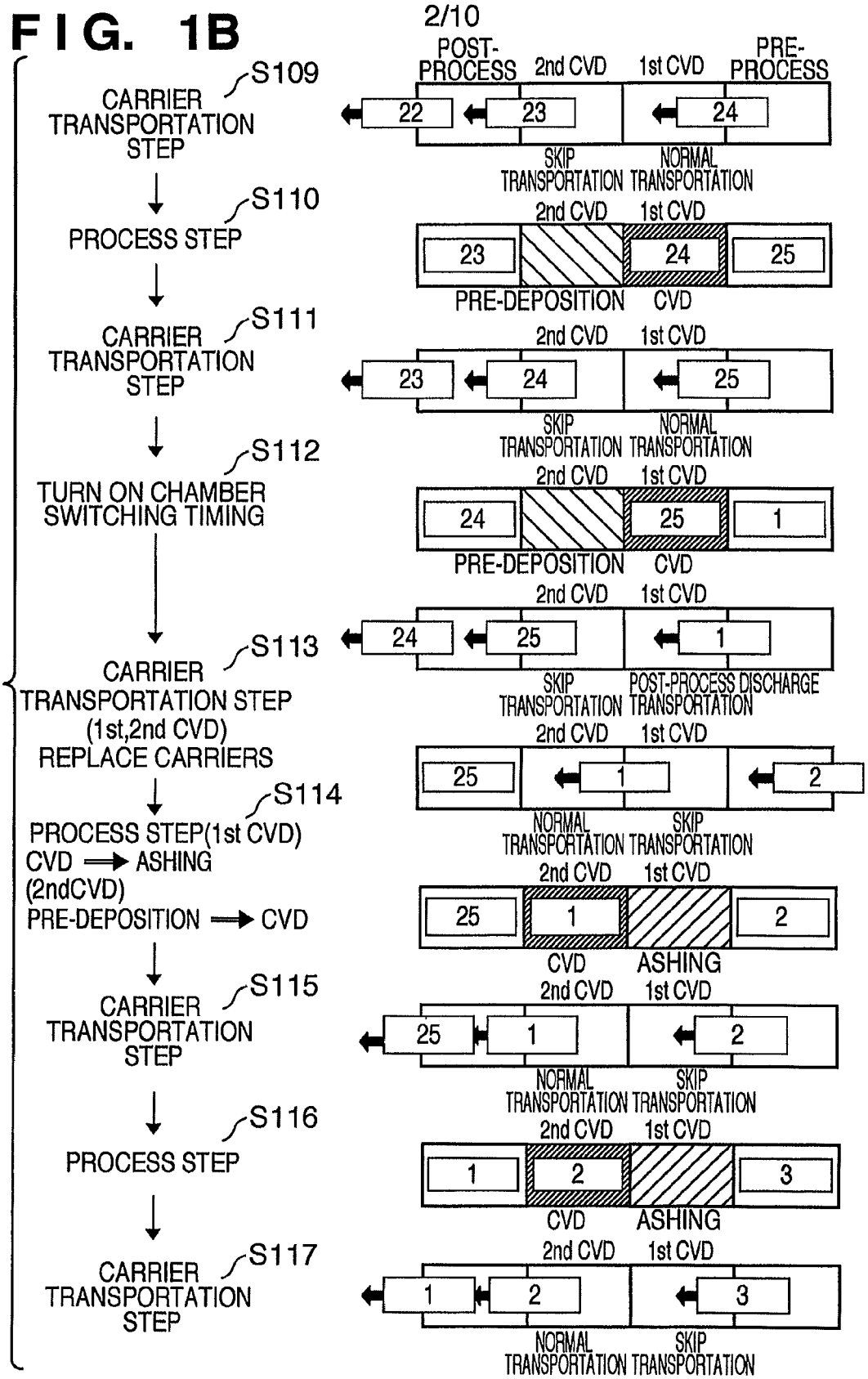
FIG. 1B is a view for explaining the procedure of processing in the chambers included in the inline vacuum processing apparatus.
Figure 1C:
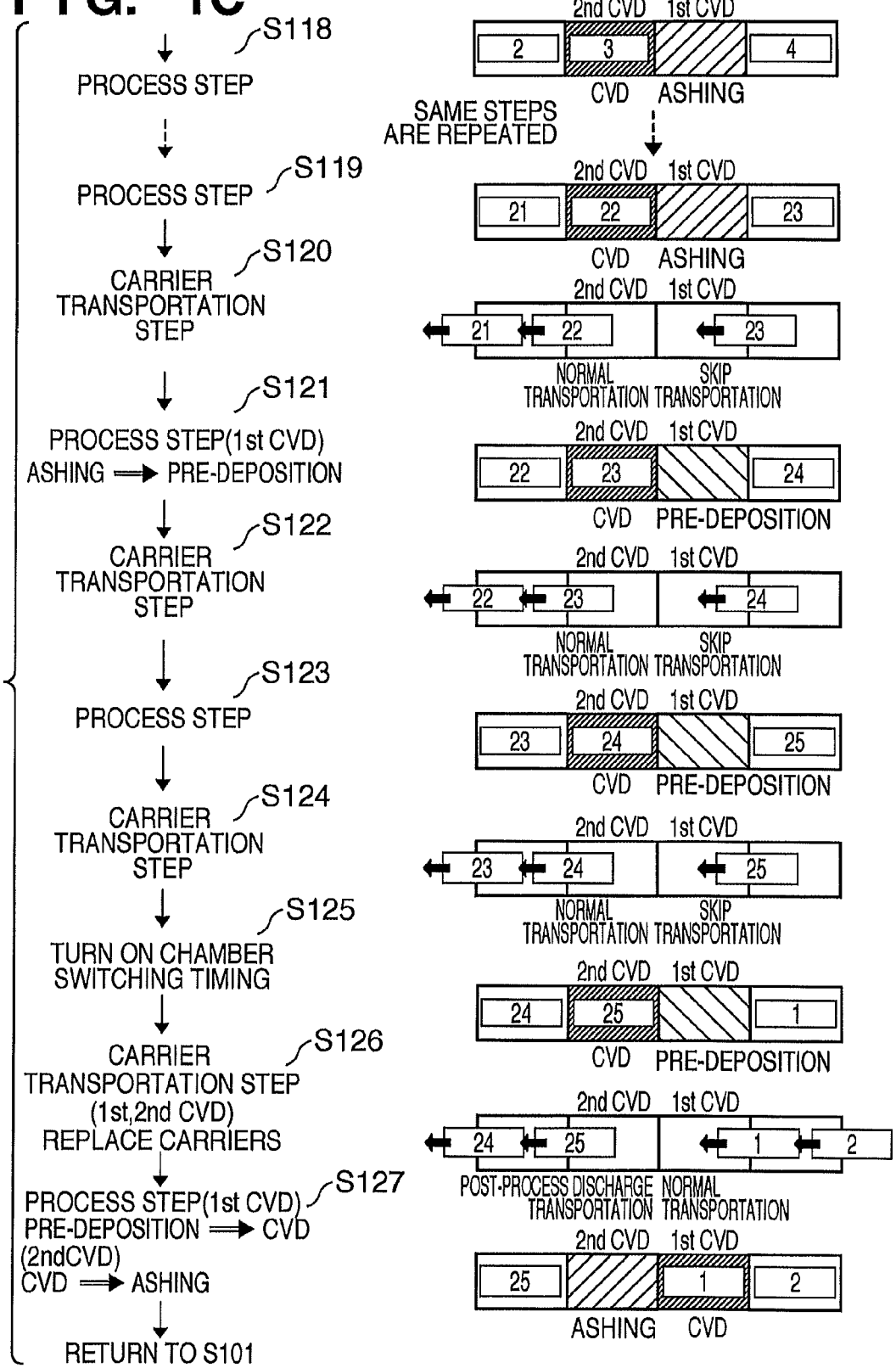
FIG. 1C is a view for explaining the procedure of processing in the chambers included in the inline vacuum processing apparatus.

FIGS. 1A to 1C are schematic views showing a partial arrangement of an inline vacuum processing apparatus according to the embodiment of the present invention. The inline vacuum processing apparatus includes, out of the plurality of chambers, a first deposition chamber (to be also referred to as a "first CVD" hereinafter) and a second deposition chamber (to be also referred to as a "second CVD" hereinafter) to be used for a deposition process, a preprocess chamber to be used for a preprocess before the deposition process, and a post-process chamber to be used for a post-process after the deposition process. The preprocess chamber is connected in series to the upstream side of the first CVD. The post-process chamber is connected in series to the downstream side of the second CVD. The second CVD is connected in series to the downstream side of the first CVD.

A master controller which controls the overall operation of the inline vacuum processing apparatus functions as a deposition unit configured to cause one deposition chamber of the first deposition chamber and the second deposition chamber to execute the deposition process so as to perform, in the same deposition chamber, the deposition process for a group of a plurality of substrates included in a first lot. The master controller also functions as a process execution unit configured to cause the other deposition chamber where the deposition process is not being performed to execute a process necessary for the deposition process while the one deposition chamber is executing the deposition process. The number of substrates processed in the one deposition chamber is measured to determine whether all substrates included in the first lot have undergone the deposition process. The master controller also functions as a control unit configured to switch, based on the determination result, the process to be executed in each deposition chamber so as to cause the other deposition chamber to execute the deposition process and cause the one deposition chamber to execute the process necessary for the deposition process.

In this embodiment, for example, since one cassette includes 25 substrates, the carrier process switching between the first CVD and the second CVD is done at a period of 25 cycles. Note that the switching timing is not limited to the period of 25 cycles. For example, the switching timing set to perform, in the same deposition chamber, the deposition process for a group of a plurality of substrates included in one lot may be set to cause one CVD chamber to execute the process N (N is a natural number) cycles equal to or larger then 25 cycles.

The number of times of process for carriers is a condition to determine the switching timing. In a chamber where ashing is being executed, the ashing process changes to a preliminary deposition process (to be referred to as a pre-deposition process hereinafter) of stabilizing the CVD environment at a timing three cycles before the switching timing, e.g., the end of the process of a group of substrates.

Figure 3:
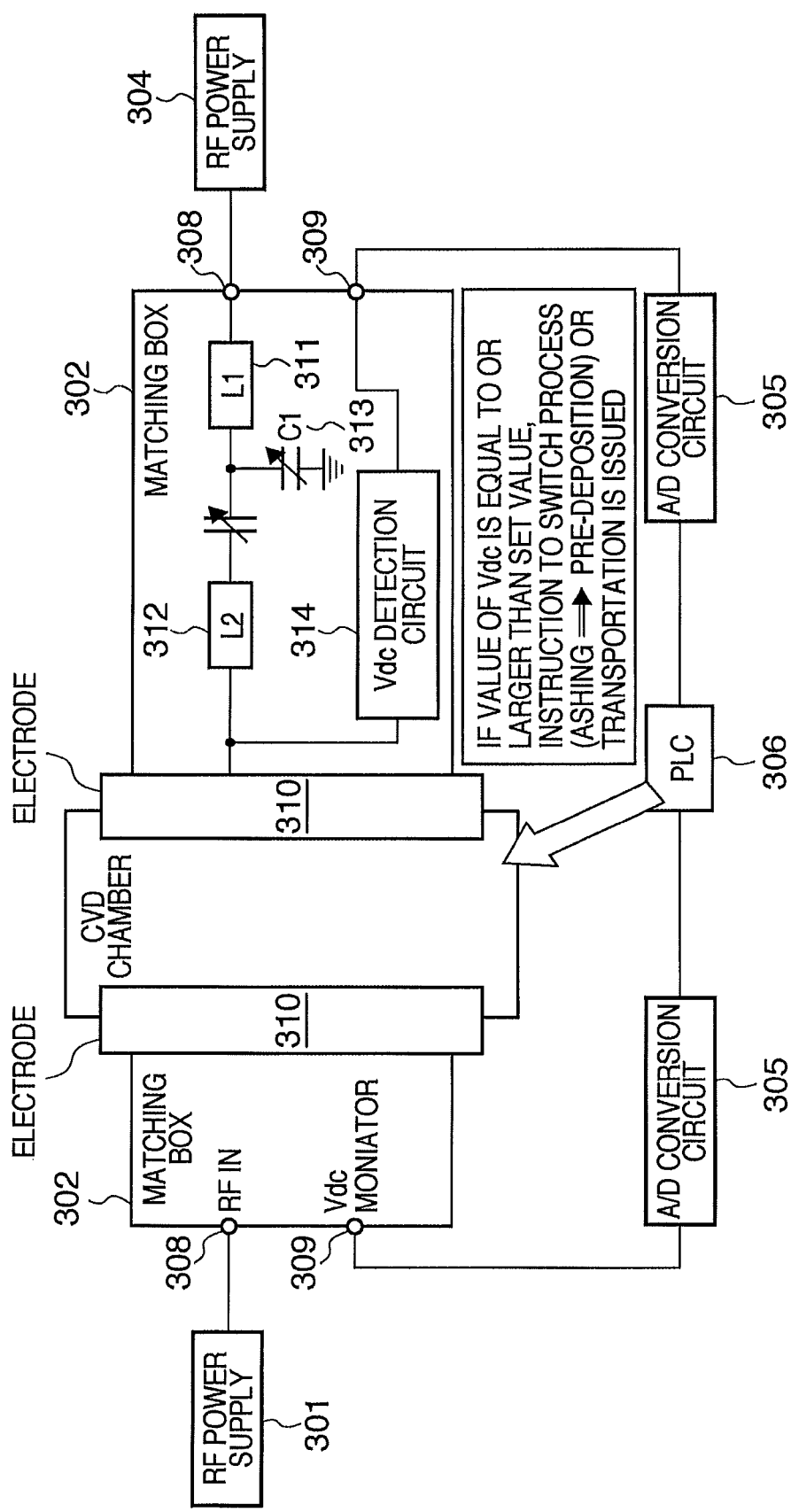
FIG. 3 is a block diagram showing the arrangement of a measuring circuit configured to measure a discharge voltage Vdc in a CVD chamber where an ashing process is being executed.

The inline vacuum processing apparatus includes a discharge voltage measuring circuit configured to measure the discharge voltage in a chamber during execution of processes (including, e.g., the ashing process) necessary for the deposition process. Whether the ashing process has ended is determined based on the discharge voltage measurement result. For example, a discharge voltage Vdc is measured in a CVD chamber where the ashing process is being executed (FIG. 3). As carbon in the chamber is removed by the ashing process, the value (absolute value) of the discharge voltage Vdc in the chamber increases. A controller 306 determines based on the measurement result of the discharge voltage Vdc whether the ashing has been performed sufficiently.

The inline vacuum processing apparatus also includes an oxygen concentration measuring circuit (FIG. 4) which measures the oxygen concentration in the chamber. Whether the pre-deposition process has ended is determined based on the oxygen concentration measurement result. The controller 306 determines based on the measurement result of the oxygen concentration in the chamber (FIG. 4) whether the pre-deposition process has been executed sufficiently. Note that FIGS. 3 and 4 will be described not here but later in detail.

Based on the measurement result of the discharge voltage Vdc and that of the oxygen concentration in the chamber, the controller 306 can decide the optimum timing of switching the CVD chamber to be used for deposition.

Referring to FIGS. 1A to 1C, reference numerals 1, 2, 3, . . . , 25 denote carriers each of which holds and transports a substrate. The carriers 1 to 25 of the first lot undergo the deposition process in the first CVD. The carriers 1 to 25 of the next lot (second lot) undergo the deposition process in the second CVD.

The procedure of processing in the chambers included in the inline vacuum processing apparatus will be explained below with reference to FIGS. 1A to 1C. In the process step (S101) shown in FIG. 1A, the first CVD processes the carrier 1. The carrier 2 is processed in a chamber (to be referred to as a "preprocess chamber" hereinafter) to execute the preprocess of the CVD. The second CVD executes the ashing process.

In the carrier transportation step (S102), the carrier 1 processed in the first CVD passes through the second CVD and is transported directly from the first CVD to a chamber (to be referred to as a "post-process chamber" hereinafter) to execute the post-process of the CVD (this transportation will be referred to as "skip transportation"). During this time, ashing in the second CVD is interrupted.

For example, the master controller controls the transportation mechanism to make a substrate (carrier) which has undergone the deposition process in the first CVD pass through another deposition chamber (the second CVD in this case) connected in series to the downstream side of one deposition chamber (the first CVD in this case) and directly transport it to the post-process chamber connected in series to the downstream side of the second CVD. The carrier 2 processed in the preprocess chamber is transported to the first CVD (this transportation will be referred to as "normal transportation").

In the process step (S103), the carrier 1 processed in the first CVD is processed in the post-process chamber. The first CVD processes the newly transported carrier 2. The carrier 3 is processed in the preprocess chamber. The second CVD executes the ashing process.

In the carrier transportation step (S104), the carrier 2 processed in the first CVD is transported directly from the first CVD to the post-process chamber through the second CVD. The carrier 3 processed in the preprocess chamber is transported to the first CVD. During this time, ashing in the second CVD is interrupted.

In the process step (S105), the carrier 2 processed in the first CVD is processed in the post-process chamber. The first CVD processes the newly transported carrier 3. The carrier 4 is processed in the preprocess chamber. The second CVD executes the ashing process.

The same processes continue up to the carrier 22. In the process step (S106), the first CVD processes the carrier 22. The carrier 23 is processed in the preprocess chamber. The second CVD executes the ashing process. The carrier 21 is being processed in the post-process chamber.

In the carrier transportation step (S107), the carrier 22 processed in the first CVD is transported directly from the first CVD to the post-process chamber through the second CVD. The carrier 23 processed in the preprocess chamber is transported to the first CVD. During this time, ashing in the second CVD is interrupted.

In the process step (S108), the carrier 22 processed in the first CVD is processed in the post-process chamber. The first CVD processes the newly transported carrier 23. The carrier 24 is processed in the preprocess chamber. The second CVD executes the pre-deposition process.

In the carrier transportation step (S109) in FIG. 1B, the carrier 23 processed in the first CVD is directly transported from the first CVD to the post-process chamber through the second CVD. The carrier 24 processed in the preprocess chamber is transported to the first CVD. During this time, the pre-deposition process in the second CVD is interrupted.

In the process step (S110), the carrier 23 processed in the first CVD is processed in the post-process chamber. The first CVD processes the newly transported carrier 24. The carrier 25 is processed in the preprocess chamber. The second CVD executes the pre-deposition process.

In the carrier transportation step (S111), the carrier 24 processed in the first CVD is directly transported from the first CVD to the post-process chamber through the second CVD. The carrier 25 processed in the preprocess chamber is transported to the first CVD. During this time, the pre-deposition process in the second CVD is interrupted.

In the process step (S112), the chamber switching timing is turned on. The carrier 24 processed in the first CVD is processed in the post-process chamber. The first CVD processes the newly transported carrier 25. The carrier 1 of the next lot is processed in the preprocess chamber. The second CVD executes the pre-deposition process.

In the carrier transportation step (S113), the carrier 25 processed in the first CVD is directly transported from the first CVD to the post-process chamber through the second CVD (transportation performed in the first CVD at this time will be referred to as "post-process discharge transportation"; the second CVD performs skip transportation). The carrier 1 of the second lot processed in the preprocess chamber is directly transported to the second CVD through the first CVD (first CVD: skip transportation, and second CVD: normal transportation). The carrier 2 of the second lot is transported to the preprocess chamber. To cause another deposition chamber (the second CVD in this case) to execute the deposition process, the master controller controls the transportation mechanism to make a substrate (carrier) in the preprocess chamber connected in series to the upstream side of the one deposition chamber (the first CVD in this case) pass through the first CVD and directly transport it to the second CVD connected in series to the downstream side of the first CVD.

In the process step (S114), the carrier 25 processed in the first CVD is processed in the post-process chamber. The second CVD processes the newly transported carrier 1 of the second lot. The carrier 2 of the second lot is processed in the preprocess chamber. The first CVD executes the ashing process.

In the carrier transportation step (S115), the carrier 1 of the second lot processed in the second CVD is transported from the second CVD to the post-process chamber. The carrier 2 of the second lot processed in the preprocess chamber is directly transported to the second CVD through the first CVD. During this time, ashing in the first CVD is interrupted.

In the process step (S116), the carrier 1 of the second lot processed in the second CVD is processed in the post-process chamber. The second CVD processes the newly transported carrier 2 of the second lot. The carrier 3 of the second lot is processed in the preprocess chamber. The first CVD executes the ashing process.

In the carrier transportation step (S117), the carrier 2 of the second lot processed in the second CVD is transported from the second CVD to the post-process chamber. The carrier 3 of the second lot processed in the preprocess chamber is directly transported to the second CVD through the first CVD. During this time, ashing in the first CVD is interrupted.

In the process step (S118) shown in FIG. 1C, the carrier 2 of the second lot processed in the second CVD is processed in the post-process chamber. The second CVD processes the newly transported carrier 3 of the second lot. The carrier 4 of the second lot is processed in the preprocess chamber. The first CVD executes the ashing process. The same processes continue up to the carrier 22 of the second lot.

In the process step (S119), the carrier 21 of the second lot processed in the second CVD is processed in the post-process chamber. The second CVD processes the newly transported carrier 22 of the second lot. The carrier 23 of the second lot is processed in the preprocess chamber. The first CVD executes the ashing process.

In the carrier transportation step (S120), the carrier 22 of the second lot processed in the second CVD is transported from the second CVD to the post-process chamber. The carrier 23 of the second lot processed in the preprocess chamber is directly transported to the second CVD through the first CVD. During this time, ashing in the first CVD is interrupted.

In the process step (S121), the carrier 22 of the second lot processed in the second CVD is processed in the post-process chamber. The second CVD processes the newly transported carrier 23 of the second lot. The carrier 24 of the second lot is processed in the preprocess chamber. The first CVD executes the pre-deposition process.

In the carrier transportation step (S122), the carrier 23 of the second lot processed in the second CVD is transported from the second CVD to the post-process chamber. The carrier 24 of the second lot processed in the preprocess chamber is directly transported to the second CVD through the first CVD. During this time, the pre-deposition process in the first CVD is interrupted.

In the process step (S123), the carrier 23 of the second lot processed in the second CVD is processed in the post-process chamber. The second CVD processes the newly transported carrier 24 of the second lot. The carrier 25 of the second lot is processed in the preprocess chamber. The first CVD executes the pre-deposition process.

In the carrier transportation step (S124), the carrier 24 of the second lot processed in the second CVD is transported from the second CVD to the post-process chamber. The carrier 25 of the second lot processed in the preprocess chamber is directly transported to the second CVD through the first CVD. During this time, the pre-deposition process in the first CVD is interrupted.

In the process step (S125), the chamber switching timing is turned on. The carrier 24 processed in the second CVD is processed in the post-process chamber. The second CVD processes the newly transported carrier 25. The carrier 1 of the next third lot is processed in the preprocess chamber. The first CVD executes the pre-deposition process.

In the carrier transportation step (S126), the carrier 25 of the second lot processed in the second CVD is transported from the second CVD to the post-process chamber (second CVD: post-process discharge transportation). The carrier 1 of the third lot processed in the preprocess chamber is transported to the first CVD (first CVD: normal transportation).

In the process step (S127), the carrier 25 processed in the second CVD is processed in the post-process chamber. The first CVD processes the newly transported carrier 1 of the third lot. The carrier 2 of the third lot is processed in the preprocess chamber. The second CVD executes the ashing process.

From then on, the same process as that of step S101 described above is repeated.

FIG. 3 is a block diagram showing the arrangement of a discharge voltage measuring circuit configured to measure the discharge voltage Vdc in the CVD chamber where the ashing process is being executed.

A matching box 302 has a terminal (RF IN) 308 connected to an RF power supply (high frequency power supply) 301 and a Vdc monitor terminal (Vdc MONITOR) 309. The output from the Vdc monitor terminal is input to the controller (programmable logic controller; to be abbreviated as a "PLC" hereinafter) 306 via an A/D conversion circuit 305.

In the deposition chamber of the present invention, two identical electrodes 310 are configured to face both surfaces of a substrate to perform deposition on both surfaces of the substrate at once. The identical matching boxes 302 are attached to the electrodes 310, respectively. FIG. 3 illustrates and explains the arrangement of the matching box on the right side. The matching box 302 includes reactances L1 311 and L2 312 and a capacitor C1 313 connected to an RF power supply (high frequency power supply) 304, and a Vdc detection circuit 314. The output from the Vdc detection circuit 314 is input to the controller (PLC) 306 via an A/D conversion circuit 305. Based on the input from the A/D conversion circuit 305, the controller 306 determines whether carbon in the chamber has been removed sufficiently by the ashing process. If the value of Vdc is equal to or larger than a predetermined set value, the controller 306 determines that carbon in the chamber has sufficiently been removed, and controls to switch the process from the ashing process to the pre-deposition process. As the predetermined set value of Vdc, experiments are carried out in advance under a process condition to be used, thereby obtaining a value when carbon has sufficiently been removed. The value is stored in the controller 306 and compared with Vdc to do the determination.

FIG. 7 is a graph showing a Vdc measurement result when the ashing processes (20 times), pre-deposition processes (5 times), and deposition processes (25 times) have been executed. In the ashing processes (20 times), Vdc stabilizes at the level of −1,200 V in the first to eighth ashing processes. Vdc abruptly rises from the level of −1,200 V to the level of −400 V in the ninth ashing process and then stabilizes at the level of −400 V in the subsequent ashing processes. Based on this measurement result, when Vdc has a value equal to or larger than the predetermined set value (threshold) of, e.g., −500 V, the controller 306 can determine that the ashing has ended.

The criterion to be used to determine the end of ashing is not limited to the value of Vdc. The end of ashing may be determined when Vdc has reached a predetermined set value (threshold) and then ashing has been executed N (N is a natural number) times furthermore.

If the CVD process starts immediately after ashing, film having required characteristics can not be obtained because of residual oxygen in the process chamber. Normally, the atmosphere is stabilized after that by performing the CVD process under the deposition condition. This process is called a pre-deposition process. The present invention also proposes a unit configured to detect the end of this process.

When the pre-deposition process starts, a light emission detection unit detects light emission in the chamber. In this embodiment, an Si photodiode capable of detecting a wavelength range of 190 to 1,100 nm was used. Deposition of diamond-like carbon (to be also abbreviated as DLC) was performed as the CVD process. $C_2H_4$ was used as the source gas. An RF power of 300 W was applied to deposit a DLC film in a chamber at a pressure of 1.3 Pa. After the asking process was executed in the chamber, the pre-deposition process was performed under the same condition as that for the above-described CVD process. The pre-deposition process may be executed under a condition different from that for the CVD process, as a matter of course.

Figure 5:
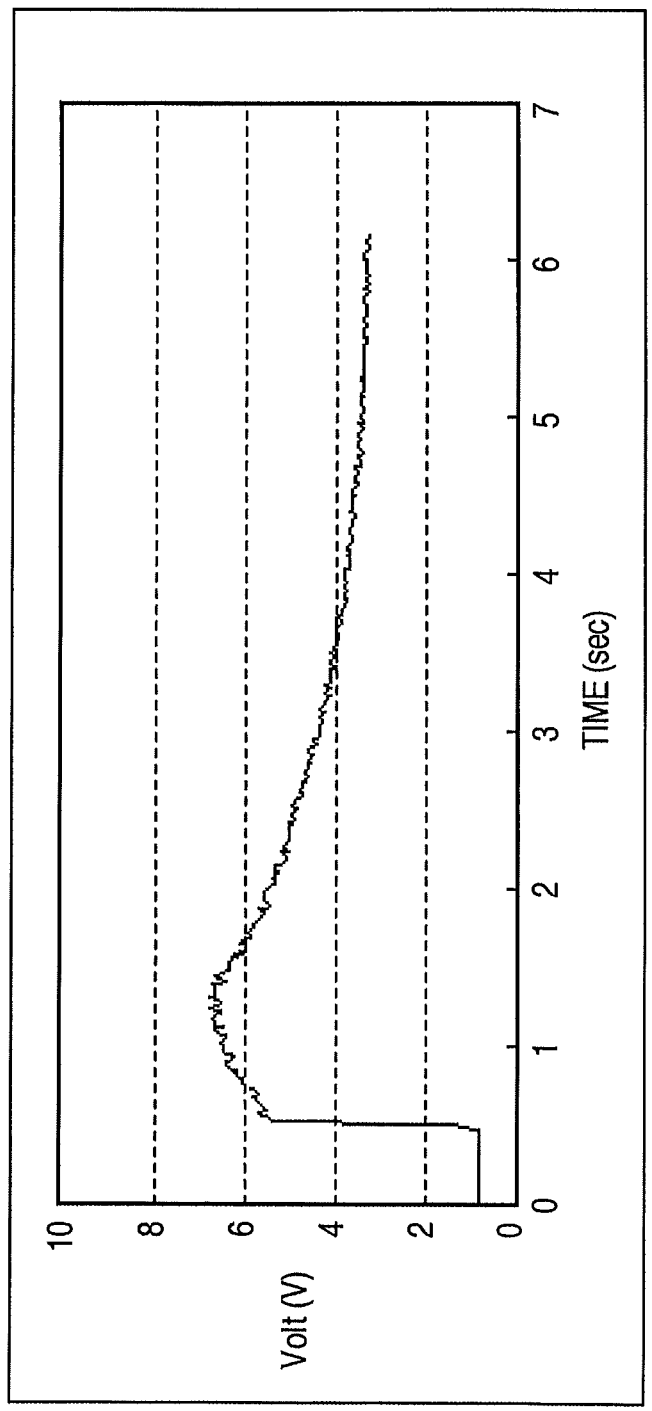
FIG. 5 is a graph for explaining detection of a cleaning end point by discharged light.

FIG. 5 shows the waveform of the signal detected by the light emission detection unit. In this embodiment, the end (end point) of the pre-deposition process is detected by the following means.

Fundamentally, when the pre-deposition process progresses, light emission from oxygen decreases. This is because the amount of light emission (e.g., 777 nm, 616 nm) from oxygen atoms and the like is supposed to decrease along with the decrease in the amount of residual oxygen. For example, by moving a group of signals obtained from the output, the slope with respect to the time is obtained between a plurality of points. When the slope has reached a predetermined value (reference value), it is determined that the pre-deposition process has ended. In the above-described embodiment, it is determined that the pre-deposition process has ended when the absolute value of the negative slope has become smaller than the predetermined value.

Figure 6:
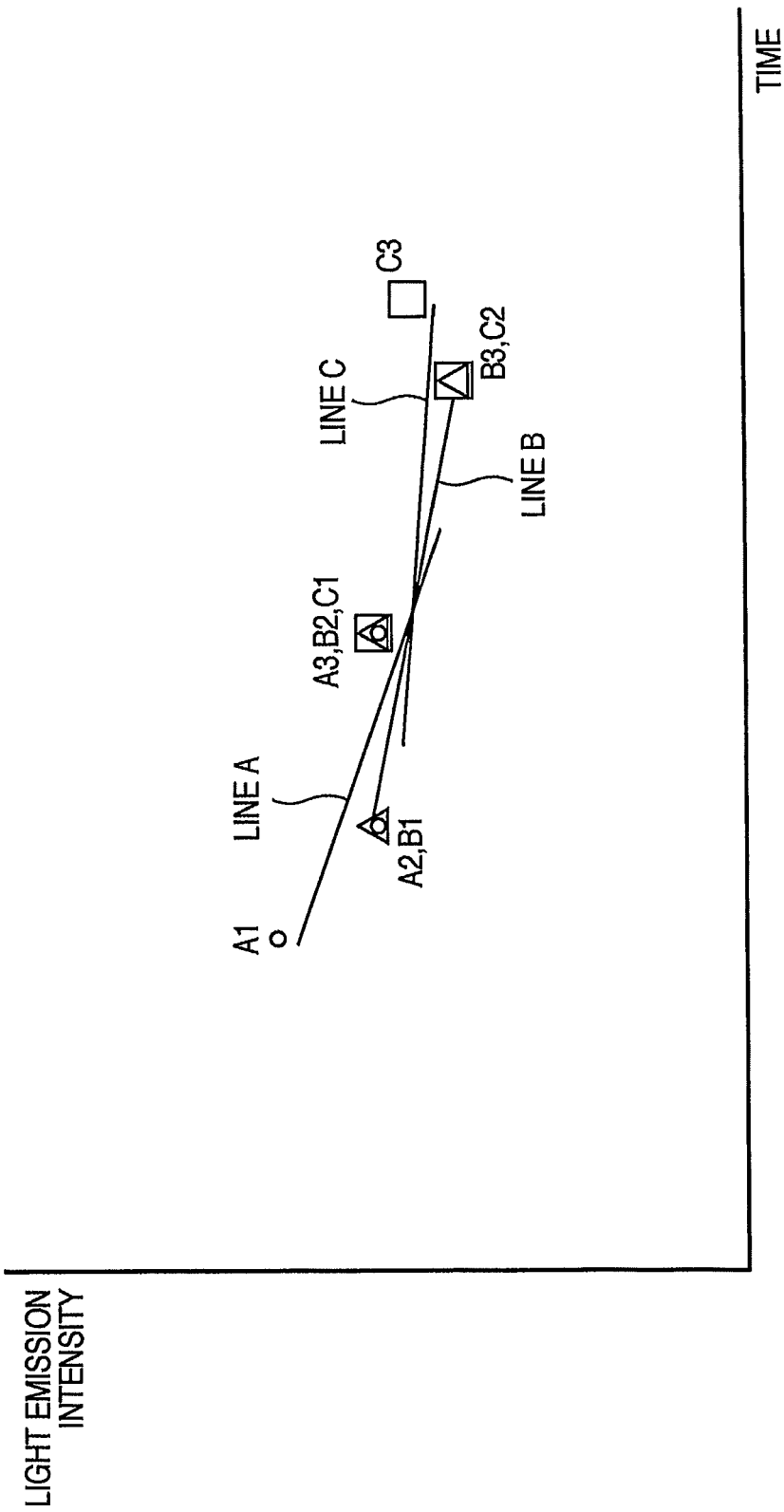
FIG. 6 is a graph for explaining an example of pre-deposition process completion detection using the least squares method.

As the predetermined value (reference value), a slope value at which the pre-deposition process is determined to have ended is decided by conducting experiments in advance. The method of obtaining the slope will be described in detail with reference to FIG. 6. This method enables the above-described light emission detection unit, e.g., photodiode to detect the intensity of light emission from the chamber at a predetermined time interval.

First, the least squares method is applied to three data A1 to A3 to interpolate the three points, thereby obtaining a line A. A slope A of the line A at that time is obtained. If the absolute value |A| of the obtained slope is smaller than the above-described predetermined value (reference value), it can be determined at that point of time that the pre-deposition process has ended.

If the absolute value of the slope at that point of time is not smaller than the predetermined value (reference value), the pre-deposition process is continued, and data B3 of the next signal is acquired. The least squares method is applied to three data including the data B3 of the signal and the data A2 and A3 corresponding to the two signals acquired precedingly, i.e., three points of A2=B1, A3=B2, and B3 (new signal) to interpolate the three points, thereby obtaining a line B. If the absolute value |B| of the slope of the obtained line B is smaller than the above-described predetermined value (reference value), it can be determined at that point of time that the pre-deposition process has ended.

If the absolute value of the slope at that point of time is not smaller than the predetermined value (reference value), the pre-deposition process is continued, and data C3 of the next signal is acquired. The least squares method is applied to three data including the data C3 of the signal and the data B2 (=A3) and B3 of the two signals acquired precedingly, i.e., three points of B2 (=A3)=C1, B3=C2, and C3 (new signal) to interpolate the three points, thereby obtaining a line C. If the absolute value |C| of the slope of the obtained line C is smaller than the above-described predetermined value (reference value), it can be determined at that point of time that the pre-deposition process has ended.

The above-described process is repeated until the absolute value of the slope becomes smaller than the predetermined value (reference value). In the example shown in FIG. 6, each interpolated line is obtained from three points. However, the number of points is not always limited to three. The least squares method is used as the interpolation method. However, the interpolation method is not limited to this. Polynomial approximation, logarithmic approximation, power approximation, exponential approximation, or the like can be applied as needed.

As a simpler method, the time the pre-deposition process has ended may be determined when the signal from the light emission detection unit has become smaller than a predetermined value (reference value). Alternatively, the time the pre-deposition process has ended may be determined by the average value of data at a plurality of points, i.e., the so-called moving average method. Using the above-described moving average method of the plurality of points allows to prevent any determination error of the end of the pre-deposition process caused by noise.

Figure 4:
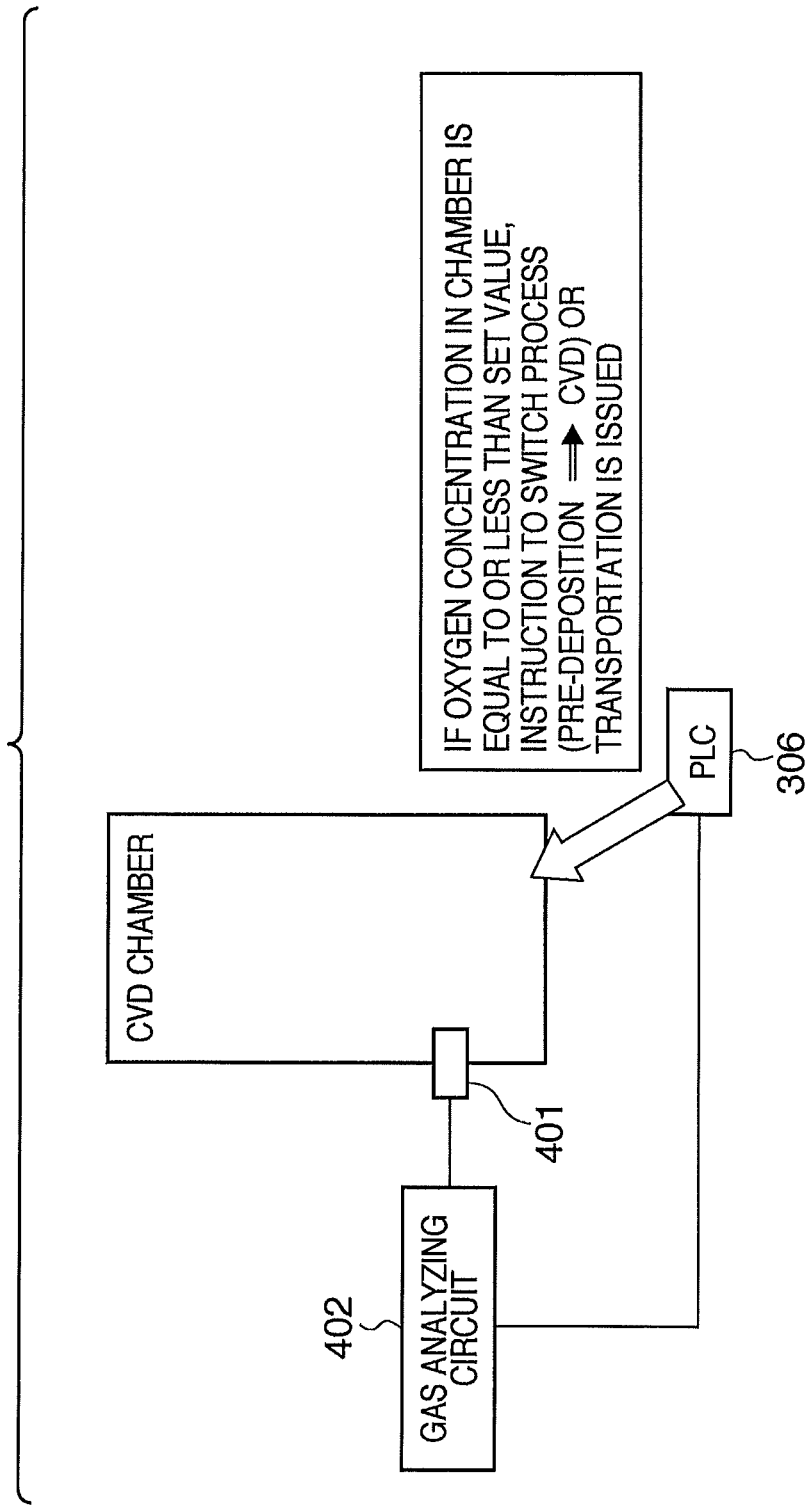
FIG. 4 is a block diagram showing the arrangement of a measuring circuit configured to measure an oxygen concentration in a chamber.

FIG. 4 is a block diagram showing the arrangement of an oxygen concentration measuring circuit configured to measure the oxygen concentration in the chamber where the pre-deposition process is being executed. A mass analyzer 401 functioning as a detection unit configured to detect the oxygen concentration is connected to the CVD chamber. The detection result is input to the controller (PLC) 306 via a gas analyzing circuit 402.

When the oxygen concentration in the chamber has become equal to or smaller than a predetermined set value, the controller (PLC) 306 determines that the CVD environment has stabilized, and controls to switch the process from the pre-deposition process to the CVD process. For the predetermined set value of the oxygen concentration, experiments are carried out in advance under a process condition to be used, thereby obtaining a value when the oxygen concentration has sufficiently lowered. The value is stored in the controller 306 and compared with the oxygen concentration to do the determination.

The controller 306 in FIGS. 3 and 4 is provided in correspondence with each chamber. Each controller 306 is connected, via a network (not shown), to the master controller (not shown) which controls the overall operation of the inline vacuum processing apparatus. The master controller controls the operation of the transportation mechanism (not shown) to switch carrier transportation (normal transportation, post-process discharge transportation, or skip transportation) in accordance with the switched process control of each chamber.

Figure 2B:
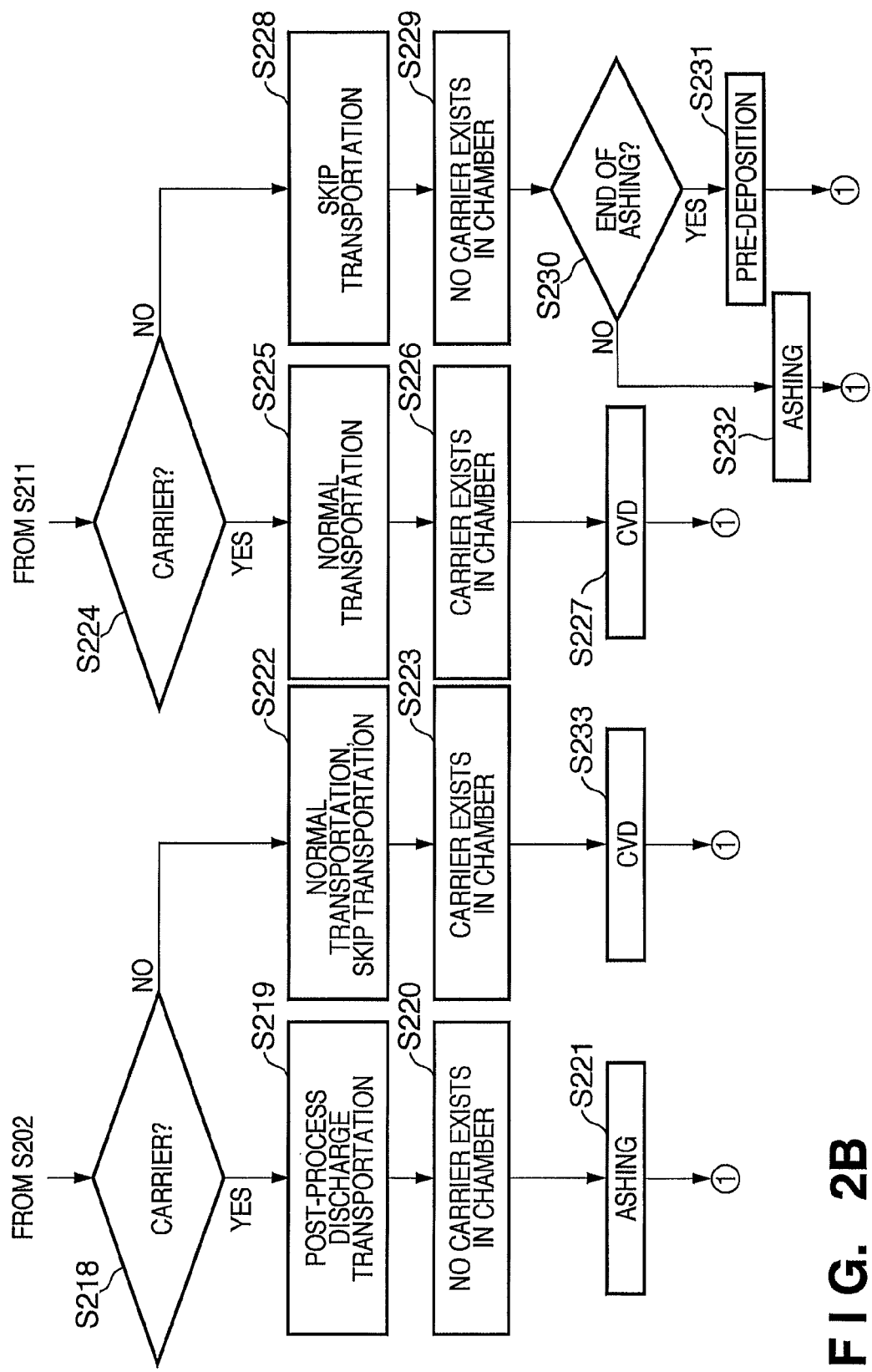

FIGS. 2A and 2B are flowcharts for explaining the procedure of changing the carrier transportation form. Changing the carrier transportation form indicates, for, e.g., the first CVD chamber, that the form of performing normal transportation with carrier stop in the first CVD chamber changes to the form of performing skip transportation that transports the carrier to the downstream chamber without stop in the first CVD chamber, and vice versa.

The controller 306 attached to each chamber counts the number of substrates processed in that chamber and sends the number to the master controller (not shown) which controls the overall operation of the inline vacuum processing apparatus. The master controller determines whether it is the chamber switching timing (S201). The chamber switching timing is, for example, the timing of ending the process of the substrates in one cassette.

If it is the chamber switching timing, the process advances to step S202. If the process does not concern the first CVD chamber, the process advances to step S218. If it is determined in step S202 that the process concerns the first CVD chamber, the process advances to step S203. The controller 306 of each chamber confirms whether a carrier exists in the chamber (S203). If it is determined upon confirming the state of the first CVD chamber that a carrier exists in it (YES in step S203), this indicates that the CVD process is being executed in the first CVD chamber. The carrier having the substrate which has undergone the CVD process in the chamber is transported to the post-process chamber on the downstream side. After that, a carrier having an unprocessed substrate is transported to the second CVD chamber while skipping the first CVD chamber (S204). That is, the carrier transportation form of the first CVD chamber changes from normal transportation to skip transportation. As a result, no carrier remains in the first CVD chamber (S205).

The process form then shifts to the ashing process without any carrier (S206). When the process has ended (S207), the process returns to step S201.

On the other hand, if no carrier exists in the first CVD chamber (NO in step S203), the transportation form then needs to change to perform CVD in the first CVD chamber. This is because it is the chamber switching timing (YES in step S201).

The carrier transportation of the first CVD chamber changes to normal transportation (S208) to stop a carrier in the first CVD chamber. That is, the carrier transportation form of the first CVD chamber changes from skip transportation to normal transportation.

From then on, a carrier stops in the first CVD chamber to perform deposition on the substrate held on the carrier. As a result, a carrier exists in the first CVD chamber (S209), and the CVD process is executed (S210). When the process has ended (S207), the process returns to step S201.

On the other hand, if it is not the chamber switching timing (NO in step S201), the carrier transportation form is maintained as ever.

Hence, if a carrier exists in the first CVD chamber (YES in steps S211 and S212), normal transportation of stopping a carrier in the first CVD is maintained (S208). If no carrier exists (NO in step S212), skip transportation (S213) is maintained. The first CVD chamber where normal transportation is performed has a carrier (S209) and executes the CVD process (S210). The first CVD chamber where skip transportation is performed has no carrier (S214) and executes ashing or pre-deposition. If an ashing completion detection unit described before has detected completion of ashing (YES in step S215), the process in the first CVD chamber shifts to the pre-deposition process (S216). If the ashing completion detection unit has not detected completion of ashing yet (NO in step S215), the ashing process (S217) is maintained. When the process has ended (S207), the process returns to step S201.

If it is the chamber switching timing, and it is determined upon confirming the state of the second CVD chamber that a carrier exists in it (YES in step S218), the carrier having the substrate which has undergone the CVD process in the chamber is transported to the post-process chamber on the downstream side (S219).

The second CVD chamber itself which has transported the carrier to the post-process chamber has no carrier (S220), and the process form shifts to the asking process without a carrier (S221). When the process has ended (S207), the process returns to step S201.

After that, the carrier transportation form of the second CVD chamber changes to skip transportation to transport a carrier to the post-process chamber without stopping it in the second CVD chamber (S228).

If it is determined upon confirming the state of the second CVD chamber that no carrier exists in it (NO in step S218), the process form shifts to the deposition process in the second CVD. As for the second CVD chamber, first, a carrier is transported from the first CVD chamber to the post-process chamber while skipping the second CVD chamber. Then, the carrier transportation form changes to normal transportation to stop a carrier from the preprocess chamber at the second CVD chamber while skipping the first CVD (S222). As a result, the second CVD chamber has a carrier (S223), and the process form shifts to the deposition process by CVD (S233). When the process has ended (S207), the process returns to step S201.

If it is not the chamber switching timing (NO in step S201), and it is determined upon confirming the state of the second CVD chamber that a carrier exists in it (YES in step S224), the state in which the CVD process is executed in the second CVD chamber is maintained.

That is, in the second CVD chamber, normal transportation is maintained to transport a carrier from the preprocess chamber to the second CVD chamber while skipping the first CVD. A carrier exists in the second CVD chamber (S226), and the CVD process is executed (S227). When the process has ended (S207), the process returns to step S201.

If no carrier exists in the second CVD chamber (NO in step S224), this indicates that the ashing process or the pre-deposition process is being executed in the second CVD. The process form is maintained. That is, as for the second CVD chamber, skip transportation is performed to transport, through the second CVD chamber, a carrier holding a substrate which has undergone the CVD process in the first CVD chamber (S228). No carrier remains in the chamber (S229). If the ashing completion detection unit to be described before has detected completion of ashing (YES in step S230), the process in the second CVD chamber shifts to the pre-deposition process (S231). If the ashing completion detection unit has not detected completion of ashing yet (NO in step S230), the ashing process (S232) is maintained.

The second CVD chamber maintains the ashing process or the pre-deposition process. When the process has ended (S207), the process returns to step S201.

An information recording medium (information recording disk) manufacturing method includes the step of performing deposition on a substrate using the above-described inline vacuum processing apparatus.

As described above, according to this embodiment, it is possible to provide an inline vacuum processing apparatus capable of substantially shortening the carbon protective film formation time and improving the productivity without becoming bulky and expensive.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-335157, filed Dec. 26, 2008, and Japanese Patent Application No. 2009-284468, filed Dec. 15, 2009, which are hereby incorporated by reference herein in their entirety.

What is claimed is:

1. An inline vacuum processing apparatus, comprising:
a first deposition chamber and a second deposition chamber which are capable of performing any of a CVD process, an ashing process, and a pre-deposition process,
a substrate transportation apparatus which transports, in only one direction, a substrate into said first deposition chamber and said second deposition chamber,
a control unit configured to select one of the CVD process, the ashing process, and the pre-deposition process to be selectively performed in said first deposition chamber and said second deposition chamber,
wherein said first deposition chamber and said second deposition chamber are connected in series along a direction in which the substrate is transported by the substrate transportation apparatus,
wherein said control unit selects one of said first deposition chamber and said second deposition chamber as the deposition chamber to be used for the CVD process of the substrate for a consecutive predetermined number of times, and
said control unit selects, in a state where the substrate does not exist in the other of said first deposition chamber and said second deposition chamber, one of the ashing process and the pre-deposition process as a process to be performed in the other of said first deposition chamber and said second deposition chamber while the CVD process is performed consecutively in said one deposition chamber of said first deposition chamber and said second deposition chamber,
wherein in a case where the one deposition chamber is connected to an upstream side of the other deposition chamber, said control unit controls transportation of the substrate so that the substrate on which the CVD process has been executed in the one deposition chamber passes through the other deposition chamber and is transported directly from the one deposition chamber, through the other deposition chamber, to a chamber, connected in series to a downstream side of the other deposition chamber, to execute a post-process of the CVD process, during the transportation of the substrate in the other deposition chamber, the pre-deposition process or the ashing process in the other deposition chamber is interrupted.

2. The apparatus according to claim 1, wherein
the ashing process and the pre-deposition process are selected the predetermined number of times in total as the processes to be performed in said other deposition chamber while the CVD process is performed consecutively the predetermined number of times in said one deposition chamber of said first deposition chamber and said second deposition chamber, and
the ashing process is selected a first number of times of the predetermined number of times, and the pre-deposition process is selected a second number of times.

3. The apparatus according to claim 1, further comprising a substrate cassette which is loaded/unloaded into/from the inline vacuum processing apparatus while keeping the substrate mounted,
wherein the predetermined number of times equals the number of substrates mountable on said substrate cassette, and
said control unit selects only said one deposition chamber of said first deposition chamber and said second deposition chamber as the deposition chamber to be used for the CVD process of the predetermined number of substrates mounted on one substrate cassette.

4. The apparatus according to claim 1, further comprising a discharge voltage measuring unit configured to measure a discharge voltage in the deposition chamber during execution of the ashing process,
wherein said control unit determines, based on a measurement result from said discharge voltage measuring unit, whether the ashing process has ended.

5. The apparatus according to claim 1, wherein
after the one of said first deposition chamber and said second deposition chamber has been used as the deposition chamber for the CVD process of the substrate for the predetermined number of times, the control unit then selects the other of said first deposition chamber and said second deposition chamber as the deposition chamber to be used for the CVD process of the substrate consecutively for the predetermined number of times; and
the control unit selects, in a state where the substrate does not exist in the one of said first deposition chamber and said second deposition chamber, one of the ashing process and the pre-deposition process as a process to be performed in the one of said first deposition chamber and said second deposition chamber while the CVD process is performed consecutively in said other deposition chamber of said first deposition chamber and said second deposition chamber.

6. The apparatus according to claim 1, wherein the first deposition chamber and the second deposition chamber are connected directly to each other so that a substrate can pass directly from the first deposition chamber into the second deposition chamber without having to be removed from both of the first deposition chamber and the second deposition chamber.

7. The apparatus according to claim 1, wherein the first deposition chamber, the second deposition chamber, and the chamber connected in series to a downstream side of the other deposition chamber are connected directly to each other so that a substrate can pass directly through the three chambers without having to be removed from the three chambers.

8. An inline vacuum processing apparatus, comprising:
- a first deposition chamber and a second deposition chamber which are capable of performing any of a CVD process, an ashing process, and a pre-deposition process,
- a substrate transportation apparatus which transports, in only one direction, a substrate into said first deposition chamber and said second deposition chamber,
- a control unit configured to select one of the CVD process, the ashing process, and the pre-deposition process to be selectively performed in said first deposition chamber and said second deposition chamber,
- wherein said first deposition chamber and said second deposition chamber are connected in series along a direction in which the substrate is transported by the substrate transportation apparatus,
- wherein said control unit selects one of said first deposition chamber and said second deposition chamber as the deposition chamber to be used for the CVD process of the substrate for a consecutive predetermined number of times, and
- said control unit selects, in a state where the substrate does not exist in the other of said first deposition chamber and said second deposition chamber, one of the ashing process and the pre-deposition process as a process to be performed in the other of said first deposition chamber and said second deposition chamber while the CVD process is performed consecutively in said one deposition chamber of said first deposition chamber and said second deposition chamber,
- wherein in a case where the one deposition chamber is connected to a downstream side of the other deposition chamber, said control unit controls transportation of the substrate so that the substrate passes through the other deposition chamber connected in series to an upstream side of the one deposition chamber, and is transported directly from a chamber connected in series to an upstream side of the other deposition chamber to the one deposition chamber, during the transportation of the substrate in the other deposition chamber, the pre-deposition process or the ashing process in the other deposition chamber is interrupted.

* * * * *